United States Patent [19]
Ishikawa et al.

[11] Patent Number: 5,213,515
[45] Date of Patent: May 25, 1993

[54] CONNECTOR WITH REMOVABLE SOLDER FIXTURE PLATE

[75] Inventors: Shigeru Ishikawa, Hachioji; Yoshitsugu Fujiura, Tokyo, both of Japan

[73] Assignee: AMP (Japan) Ltd., Japan

[21] Appl. No.: 821,504

[22] Filed: Jan. 15, 1992

[30] Foreign Application Priority Data

Feb. 8, 1991 [JP] Japan .................................. 3-11095

[51] Int. Cl.⁵ .............................................. H01R 9/09
[52] U.S. Cl. ........................................ 439/79; 439/83
[58] Field of Search ............... 439/78, 79, 80, 83, 439/629, 876; 29/739, 840, 843; 228/180.2

[56] References Cited

U.S. PATENT DOCUMENTS 4,125,935 11/1978 Ammon ........................... 29/739 X
4,505,035 3/1985 Burton et al. .......................... 439/79
4,550,962 11/1985 Czeschka .............................. 439/78
4,857,017 8/1989 Erk ................................... 439/79 X

FOREIGN PATENT DOCUMENTS 1-279581 11/1989 Japan .

Primary Examiner—Larry I. Schwartz
Assistant Examiner—Khiem Nguyen

[57] ABSTRACT

An electrical connector includes a housing (12) having a horizontal mounting surface (14) and a plurality of closely spaced contacts (25, 26) with portions (25c, 26c) that are solderable to the conductive traces on a printed circuit board surface. A separable plate (30) is affixed to the housing and includes channels (32) receiving the portions (25c, 26c) to precisely position such portions for soldering to the board traces. Member (30) can be thereafter removed from housing (12) to allow full inspection of the solder joints formed during the soldering operation.

9 Claims, 2 Drawing Sheets

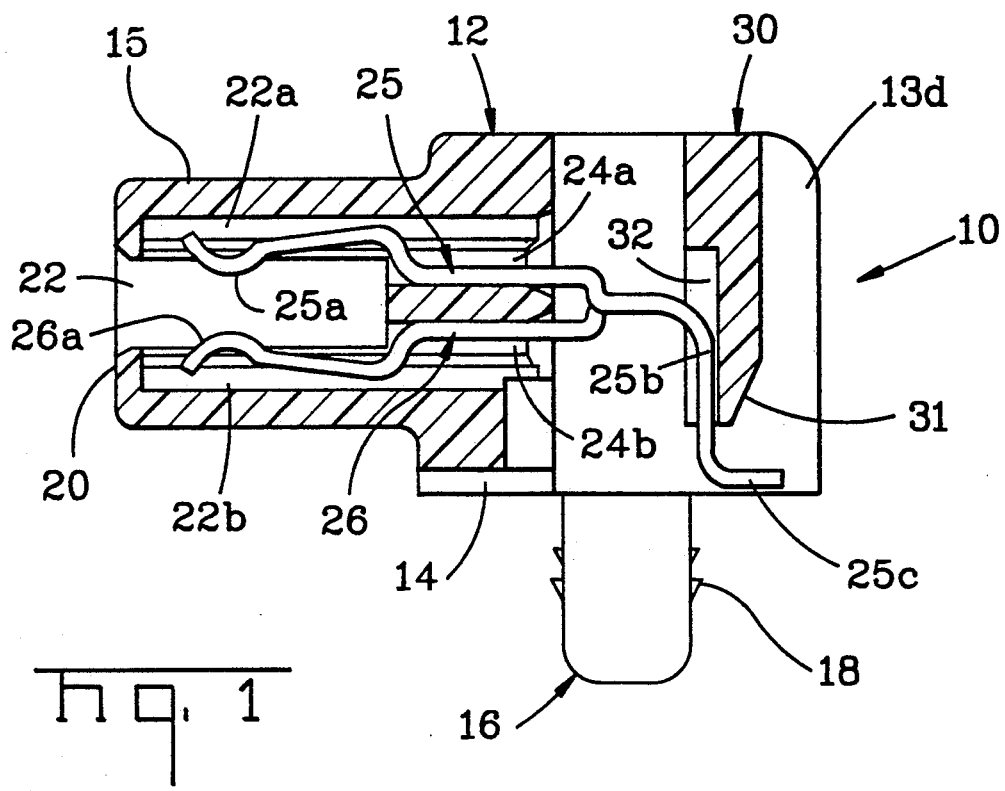
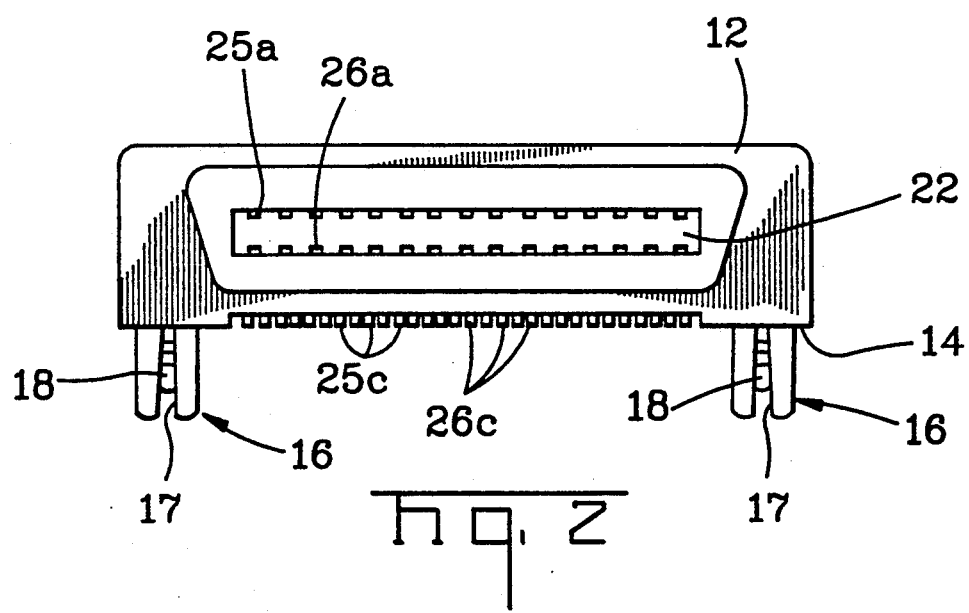

CONNECTOR WITH REMOVABLE SOLDER FIXTURE PLATE

This invention relates to an electrical connector of the solderable, surface mount type wherein contacts are mounted on closely spaced centers.

BACKGROUND OF THE INVENTION

Surface mount technology has been adopted to aid in the interconnection of components to printed circuit boards wherein the components and the conductive traces of boards are miniaturized on closely spaced centers. The conductive leads of such components, including integrated circuits, discrete components, connectors and the like, are all arranged to reside in a common plane and rest upon the surface of printed circuit boards, upon the conductive traces thereon with solder, in some form, applied with appropriate flux to either the traces of the board or the contacts themselves. Thereafter, radiation in the form of infrared or laser beam energy, or other means of applying heat, is utilized to reflow the solder to join the various leads and traces together. In such applications, it is important that the leads and traces be precisely aligned to effect a solder interconnection between lead and trace without intermittent opens or bridging of solder to adjacent leads and traces to cause short circuits. A number of components, including connectors of the type shown in Japanese Patent Publication 279581/89 features housings having guide grooves along the bottom edge, or, alternatively, holes in the housings through which tail portions of contacts are fitted and held to be in alignment with the solder traces of a board. Typically, such connectors also include mounting hardware that clamps the connector housing in a precise position on a printed circuit board. With such techniques, contacts can be surface soldered to boards, although, as the contact spacing becomes smaller and smaller, including 1.27 mm or smaller, the fineness required of the plastic housing, channels and holes, makes the housings expensive due to the fine tolerancing in molding required. Additionally, the housing material utilized to define channels and holes may obscure the solder joint resulting to create an obstacle for inspecting the solder joint either visually or automatically, using image processing techniques as a part of quality control.

Accordingly, it is an object of the present invention to provide an improved surface mount electrical connector for soldering the closely spaced contacts of the connector to closely spaced traces on a printed circuit board. It is a further object to provide an improved surface mount connector of the solder type which facilitates the soldering of closely spaced contacts to printed circuit boards and allows a better inspection of the solder joints following the soldering operation.

SUMMARY OF THE INVENTION

The foregoing objectives are achieved in the present invention through the provision of an electrical connector of the surface mount, solderable type which employs a housing containing electrical contacts positioned on appropriate centers for intermating with a further connector and with the contacts having solder portions extending from the housing in a common plane for surface mount soldering to the conductive traces of a printed circuit board. The invention housing includes grooves in the rear face thereof which receive and hold a contact fixture plate having channels defined by integral tynes that extend to align the contact solder portions relative to the housing and to a printed circuit board in a manner to facilitate exposure for heating of the solder portions. The channels precisely position the contact solder portions relative to the connector and the plate may be molded of a plastic material having characteristics to withstand soldering temperatures, to closely defined tolerances, with respect to the channels and tynes, and tolerances compatible with the connector housing with respect to the portions that fit within the grooves of the housing. The plate is made separable from the housing to be removable following the soldering operation and facilitates visual or machine inspection of the solder joint between the solder portions of the contacts and conductive traces on a printed circuit board. The connector also includes fasteners which locate the connector precisely on a printed circuit board by fitting through holes in the printed circuit board and clamping the connector housing precisely thereon and thereto. The invention contemplates use with connectors having a plurality of rows of contacts with the front portions extending in multiple planes to engage similarly disposed contacts of mating connectors and with the tail ends of the contacts interdigitated to be held by the channels and tynes of the plate member in common planes suitable for surface mounting.

IN THE DRAWINGS

FIG. 1 is a cross-sectional side view of a preferred embodiment of the connector of the invention showing the contacts disposed in a housing.

FIG. 2 is a front view of the connector shown in FIG. 1.

DETAILED DESCRIPTION OF THE INVENTION

Illustrated in FIG. 1 is a view of an electrical connector 10, in accordance with the present invention; this connector will be recognized as a receptacle connector of a type which intermates with a plug connector (not shown) having appropriate housing details and contacts to intermate with the receptacle connector in a well-known manner. The connector 10 includes an insulating housing which has a horizontal mounting surface 14 intended to rest upon the upper surface of a printed circuit board (not shown) which is made to include a series of conductive pads or traces on the upper surface thereof that lead to conductive trace circuits on or in the board. These traces in turn interconnect the leads of components or other connectors also mounted on the board and soldered to such traces. In accordance with the principles of surface mount technology, components having leads on centers compatible with the conductive traces on the surface of the boards are placed on top of the surface of the board and either held in position by fixtures or clamped to the board by fasteners after an appropriate application of solder cream and flux to the traces of the board with the board containing such components and leads thereafter being exposed to sufficient heat to cause a melting or reflow of the solder followed by a cooling and establishment of solder joints between the leads and traces of the board to provide an interconnection.

Figure 3:
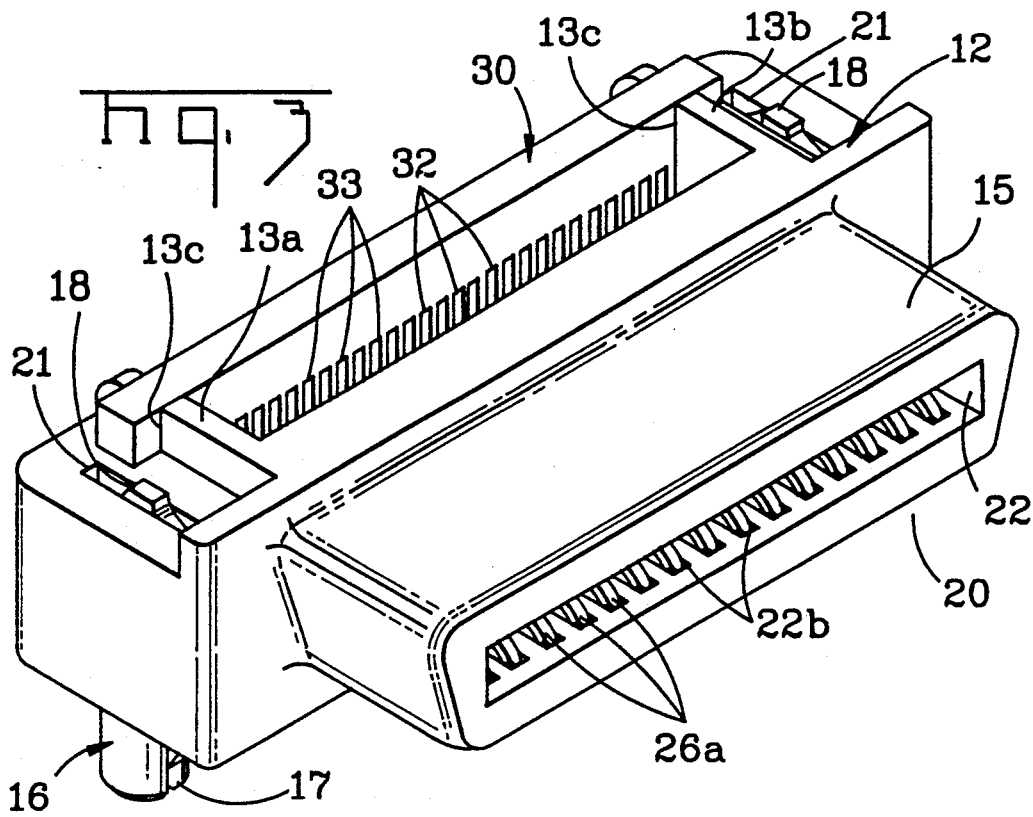
FIG. 3 is a perspective view of the connector shown in FIG. 1.
Figure 4:
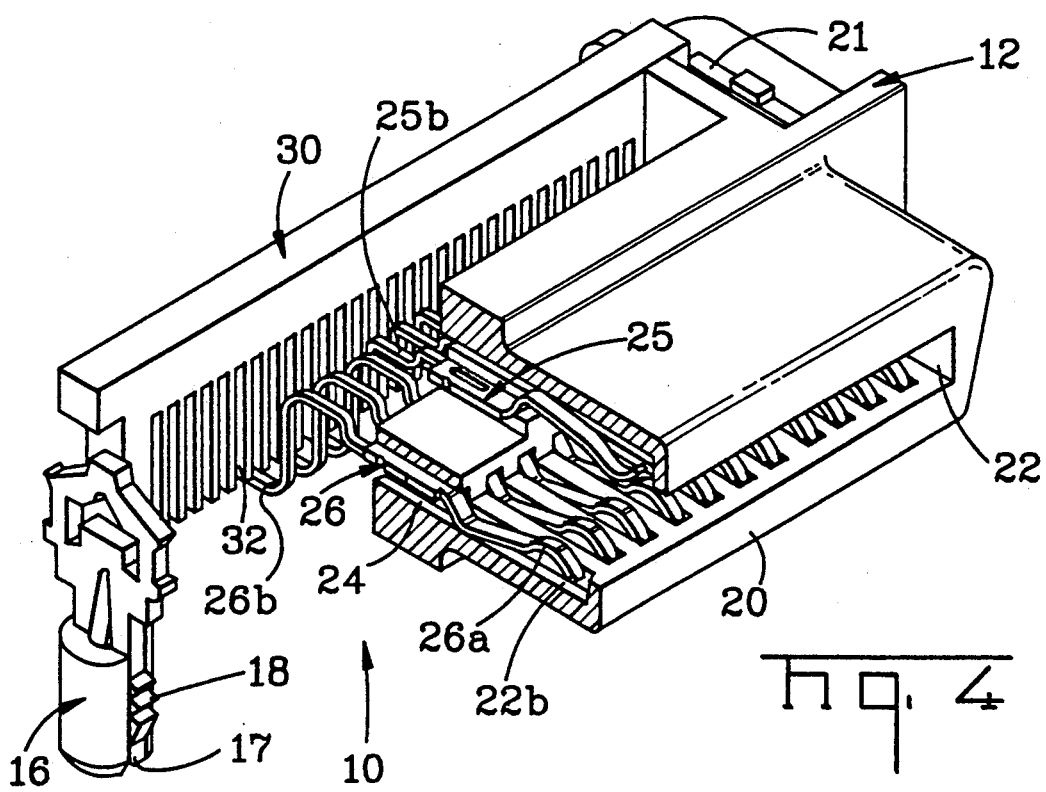
FIG. 4 is a perspective view of the connector shown in FIG. 3 with a partial sectioning to reveal details thereof.

In FIGS. 1 through 4 the connector 10 may be seen to include on each side fasteners 16 which have, as shown in FIG. 4, a plurality of mounting posts, one on each end. The mounting posts include plastic elements grooved as at 17 to contain metallic fasteners 18 having projecting points intended to resiliently bite into the surfaces of holes in the board and into the plastic material of the housings extended in grooves 21 at the ends of the housing of the connector. As can be discerned from FIGS. 1-4, the housing 12 includes a vertical mating face 20 and a horizontal recess 22 extending backwardly from the mating face into which the mating portion of a plug connector is inserted. The housing 12 includes two rows which extend along the upper and lower surfaces of the recess 22 internally of the housing to receive and retain contacts 25 and 26 therein. The contacts 25 and 26 include forward mating contact portions 25a, 26a extending internally of the housing within recesses 22, and joining portions 25b, 26b, extending rearwardly of the housing and bent substantially at right angles with respect to the surface 14 of the housing. The portions 25b and 26b lead to solder portions 25c, 26c, again bent at substantially right angles, relative to the portions 25b, 26b to reside in a plane parallel with the horizontal mounting surface 14 of the housing 12. As can be observed from FIG. 4, the contacts 25 and 26 are interdigitated with respect to the solder portions 25c, 26c, the forward ends of the contacts leading to spaced apart parallel planes wherein the contact portions 25a, 26a reside. In accordance with one embodiment of the invention, the contacts 25, 26 may be disposed on a closely spaced dimension in two rows on the order of 1.27 mm whereas the contact portions 25c, 26c can be placed on closer spaced centering on the order of 0.635 mm.

As previously mentioned, the contact solder portions 25c, 26c must be held precisely relative to contact traces on a printed circuit board to avoid short circuiting between such contacts or traces due either to the contacts touching or the solder shunting the contacts between contacts or board traces. In accordance with the invention, the housing 12 includes projecting integral portions 13a and 13b disposed generally at each end and including surfaces in the form of grooves 13c that receive a fixture plate 30 having channels 32 therein. Plate 30 is typically molded of an insulating plastic that can withstand the heat of soldering operations and still be molded with considerable precision to define the fine channels 32. The plate 30 may include a taper 31, as shown in FIG. 1, at the bottom rear end of plate 30 which helps to allow direct radiation as would be experienced through an infrared or laser beam devised to heat up the solder portions of the contact, the traces and solder thereon to effect a reflow. To be noted is the separable nature of the plate 30 with respect to the housing 12.

In accordance with use, the connector 10 of the invention would be supplied with the plate 30 in position as shown in FIG. 3. The connector would then be applied to a printed circuit board with the fasteners 16 inserted through holes in the board to clamp the housing 12 to the upper surface of the board, surface 14 and the undersurfaces of the contact portions 25c, 26c, resting on the surface of the board aligned with conductive traces of the board. At the same time, other components would be mounted on the surface of the board with the leads thereof positioned with appropriate conductive traces in a manner not shown. At this time, an appropriate solder, such as a solder cream containing an appropriate flux, would have been applied to the solder traces as by silk screening or other techniques; or, alternatively, solder material would have been applied to the leads of the connectors and components through well known means and with an appropriate flux applied. Thereafter, heat would be directed to the board and upper surface containing the components through infrared or laser energy, or vapor phase techniques to cause the solder to reflow and form solder joints between leads and contact portions to effect an interconnection. Thereafter, the plate 30 may be removed to allow a visual or machine inspection of the resulting solder joints for quality control purposes. The plate 30 may be reused or recycled, if desired, in accordance with the concept of the invention.

Having now described the invention in terms intended to enable a preferred practice thereof, claims are appended and intended to define what is inventive.

We claim:

1. An electrical connector for surface mounting to a printed circuit board and interconnecting with the contacts of a mating connector, including a dielectric housing containing a plurality of further contacts each including a contact portion at one end and a solder portion at the opposite end with the contact portions held by the housing to reside in positions for intermating to the contacts of the mated connector, a contact fixture plate having a series of open ended channels fitted over the contact portions to hold the solder portions precisely located in a position on a printed circuit board wherein said plate is removable from said housing following soldering of said further contacts to the circuit board to facilitate the inspection of solder joints formed thereby.

2. The electrical connector of claim 1 wherein the plate has a relief proximate the solder portions to facilitate heating of said portions during soldering operations.

3. The electrical connector of claim 1 wherein said housing includes means holding the housing to the printed circuit board with the printed circuit board having a surface with contact traces thereon with the further contacts including the contact portions in engagement with the surface thereof aligned with the conductive traces thereon.

4. The electrical connector of claim 1 wherein said further contacts, including said solder portions reside in two parallel planes and the further contact portions reside in a common plane.

5. The electrical connector of claim 1 wherein the further contacts, including the solder portions are interdigitated between alternative channels of the said plate.

6. An electrical connector for electrical connection to conductive traces on a circuit board comprising, a dielectric housing, electrical contacts secured in said housing, each including a contact portion at one end and connection portion at an opposite end extending along a surface of said housing in a single row to be soldered to the conductive traces, a dielectric contact-positioning plate slidably mounted onto said housing including means precisely positioning said connection portions relative to the conductive traces with said plate being removable from said housing following soldering of the connection portions to the connective traces to facilitate inspection of the soldered connection.

7. An electrical connector as claimed in claim 6, wherein the means for precisely positioning the connection portions are open ended channels formed in said plate.

8. An electrical connector as claimed in claim 6 wherein said housing includes mounting means for mounting the housings onto the circuit board.

9. An electrical connector for surface mounting to a printed circuit board and interconnecting to the contacts of a mating connector including a dielectric housing containing a plurality of further contacts each including a contact portion at one end and a solder portion at the opposite end with the solder portions being held by the housing to reside in positions for intermating to the contacts of the mated connector, a contact fixture plate having a series of open ended channels fitted over the contact portions to hold the solder portions precisely located in a position on a printed circuit board characterized in that said plate is removable from said housing following soldering of said further contacts to said circuit board to facilitate the inspection of soldering joints thereby and further characterized in that said housing includes grooves and said plate includes surfaces engaging such grooves to hold the plate in position relative to the housing.

* * * * *